(12) United States Patent
Karalar et al.

(10) Patent No.: US 9,680,478 B2
(45) Date of Patent: Jun. 13, 2017

(54) INITIALIZING A RING COUNTER

(75) Inventors: Tufan Karalar, Albany, CA (US);
David Huitse Shen, Saratoga, CA (US)

(73) Assignee: Silicon Laboratories Inc., Austin, TX (US)

( * ) Notice: Subject to any disclaimer, the term of this patent is extended or adjusted under 35 U.S.C. 154(b) by 767 days.

(21) Appl. No.: 13/242,580

(22) Filed: Sep. 23, 2011

(65) Prior Publication Data

US 2013/0077734 A1    Mar. 28, 2013

(51) Int. Cl.
*H03K 23/54* (2006.01)
*H03K 23/66* (2006.01)

(52) U.S. Cl.
CPC ........... *H03K 23/54* (2013.01); *H03K 23/665* (2013.01)

(58) Field of Classification Search
CPC .............................. H03K 23/54; H03K 23/665

USPC ..... 327/113–115, 117, 118; 377/46–48, 122, 377/124, 126
See application file for complete search history.

(56) References Cited

U.S. PATENT DOCUMENTS 4,696,020 A * 9/1987 Carlach ........................... 377/48
5,754,615 A * 5/1998 Colavin ........................... 377/47

FOREIGN PATENT DOCUMENTS

JP           11205127 A  *  7/1999  ............. H03K 23/40

* cited by examiner

*Primary Examiner* — Patrick O'Neill
(74) *Attorney, Agent, or Firm* — Trop Pruner & Hu, P.C.

(57) ABSTRACT

A technique includes driving a node of a stage of a ring counter to a predetermined signal state; and clocking the ring counter to cause the signal state to propagate to at least one additional stage of the ring counter to initialize the ring counter with a reset sequence.

13 Claims, 4 Drawing Sheets

INITIALIZING A RING COUNTER

BACKGROUND

Frequency dividers may be used for numerous applications that involve dividing the clock frequency of a higher frequency clock source. For example, a frequency divider may be used to divide the frequency of a clock signal that is provided by a crystal-based oscillator for purposes of generating a lower frequency local oscillator clock signal for a transmitter or receiver. A simple frequency divider may be formed by a ring counter, which is a circular shift register in which the most significant bit of the register is fed back to the least significant bit of the register.

SUMMARY

In an exemplary embodiment, a technique includes driving a node of a stage of a ring counter to a predetermined signal state; and clocking the ring counter to cause the signal state to propagate to at least one additional stage of the ring counter to initialize the ring counter with a reset sequence.

In another exemplary embodiment, an apparatus includes a ring counter and a controller. The ring counter includes a plurality of nodes. The controller is coupled to the ring counter to drive one of the nodes to a predetermined signal state and clock the ring counter to cause the signal state to propagate to at least one of the other nodes to initialize the ring counter with a reset sequence.

In yet another exemplary embodiment, an apparatus includes an integrated circuit that includes a ring counter and a controller. The ring counter includes a plurality of stages that include nodes. The controller is adapted to drive the node of one of the stages to a predetermined signal state and clock the ring counter to cause the signal state to propagate to the node of at least one other stage of the ring counter to initialize the ring counter with a reset sequence.

Advantages and other features disclosed herein will become apparent from the following drawing, description and claims.

DETAILED DESCRIPTION

Figure 1:
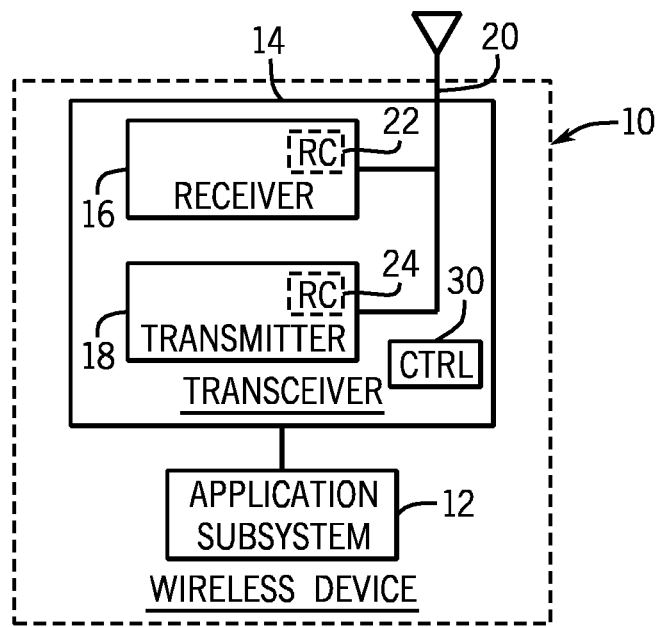
FIG. 1 is a schematic diagram of a wireless device according to an exemplary embodiment.

Referring to FIG. 1, a wireless device 10 may be used in a number of different applications for purposes of communicating data over a wireless link. As non-limiting examples, the wireless device 10 may be a personal computer (PC) peripheral; a wireless toy; a remote keyless entry; an industrial control; a home automation controller, sensor or slave device; a sensor network; etc. In general, the wireless device 10 includes an application subsystem 12, which tailors the wireless device 10 for its specific application and may, for example, form a user interface for the device 10. In general, the application subsystem 12 performs various application processing tasks relating to the application in which the wireless device 10 is employed, and these tasks may involve communicating data to a transceiver 14 of the wireless device 10 to be transmitted over a wireless link and receiving data from the transceiver 14, which was received from the wireless link. It is noted that in other exemplary embodiments, the wireless device 10 may only transmit data and not include a receiver. Thus, many variations are contemplated and are within the scope of the appended claims.

The transceiver 14 for the exemplary embodiment depicted in FIG. 1 includes a transmitter 18 that is coupled to an antenna 20 for purposes of transmitting data over the wireless link. In this manner, the transmitter 18 modulates a carrier signal with data to be transmitted and provides the resulted modulated carrier signal to the antenna 20, which radiates electromagnetic energy in response to the signal to transmit the data over the wireless link. The transceiver 14 for the embodiment depicted in FIG. 1 also includes a receiver 16, which is coupled to the antenna 20 for purposes of receiving a modulated carrier signal that is indicative of data that is received from the wireless link. The receiver 16 demodulates the modulated carrier signal to recover the transmitted data and provides this data to the application subsystem 12.

In accordance with other exemplary embodiments, the receiver 16 and the transmitter 18 may be coupled to separate antennas of the wireless device 10. Moreover, in accordance with some exemplary embodiments, the wireless device 10 may include multiple antennas 20 that the wireless device 10 selectively couples to the transmitter 18, depending on one of multiple transmission frequency bands that may be selected for the communication over the wireless link. In a similar manner, in accordance with some exemplary embodiments, the wireless device 10 may include multiple antennas 20 that the wireless device 10 selectively couples to the receiver 16, depending on one of multiple transmission frequency bands that may be selected for communication over the wireless link.

Figure 2:
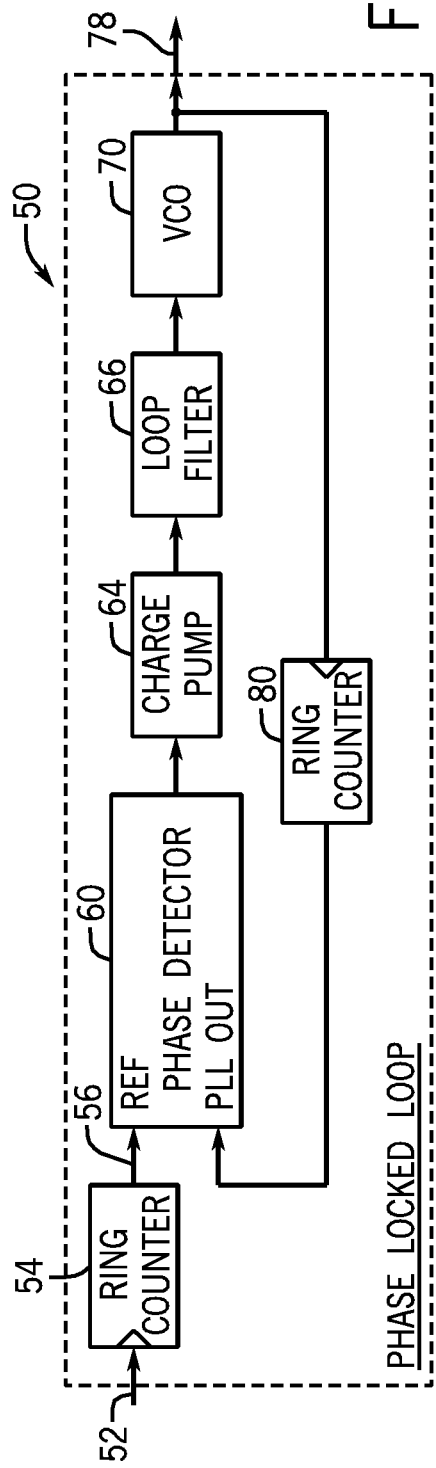
FIG. 2 is a schematic diagram of a phase locked loop according to an exemplary embodiment.

Referring to FIG. 2, as an exemplary application, a PLL 50 may contain two ring counters 54 and 80. It is noted that the PLL 50 may be part of the receiver 16 or part of the transmitter 18, depending on the particular embodiment. The PLL 50 includes a voltage-controlled oscillator (VCO) 70 that generates a signal at its output terminal 78, which has a frequency that has a predefined relationship with respect to a frequency of an input clock signal to the PLL 50, which is received on an input terminal 52. The VCO's frequency is regulated to achieve locking through the use of a feedback loop, which controls the VCO 70 based on a comparison of the PLL's output signal with the input clock signal. More specifically, the PLL 50 includes a phase detector 60 that compares the phase of the output clock signal with the input clock signal and controls a charge pump 64 accordingly. The signal that is produced by the charge pump 64 is filtered through a loop filter 66 to produce a control signal that regulates the frequency of operation of the VCO 70.

The phase detector 60 compares a frequency-divided version of the input clock signal, due to a ring counter 54 dividing the frequency of the input clock signal to produce a divided frequency clock signal to a reference input of the phase detector 60. The phase detector 60 compares the divided clock signal at its reference input terminal to a divided version of the output clock signal, which is provided by the ring counter 80. If it is assumed that the ring counter 54 is a divide by P (where "P" is an integer) frequency divider and the ring counter 80 is a divide by Q (where "Q" is an integer) frequency divider, then the target frequency of the PLL 50 is the product of the ratio Q/P and the frequency of the input clock signal. Thus, the output clock frequency of the PLL 50 may be greater than, less than or equal to the clock frequency of the input clock signal depending on the Q and P.

Figure 3:
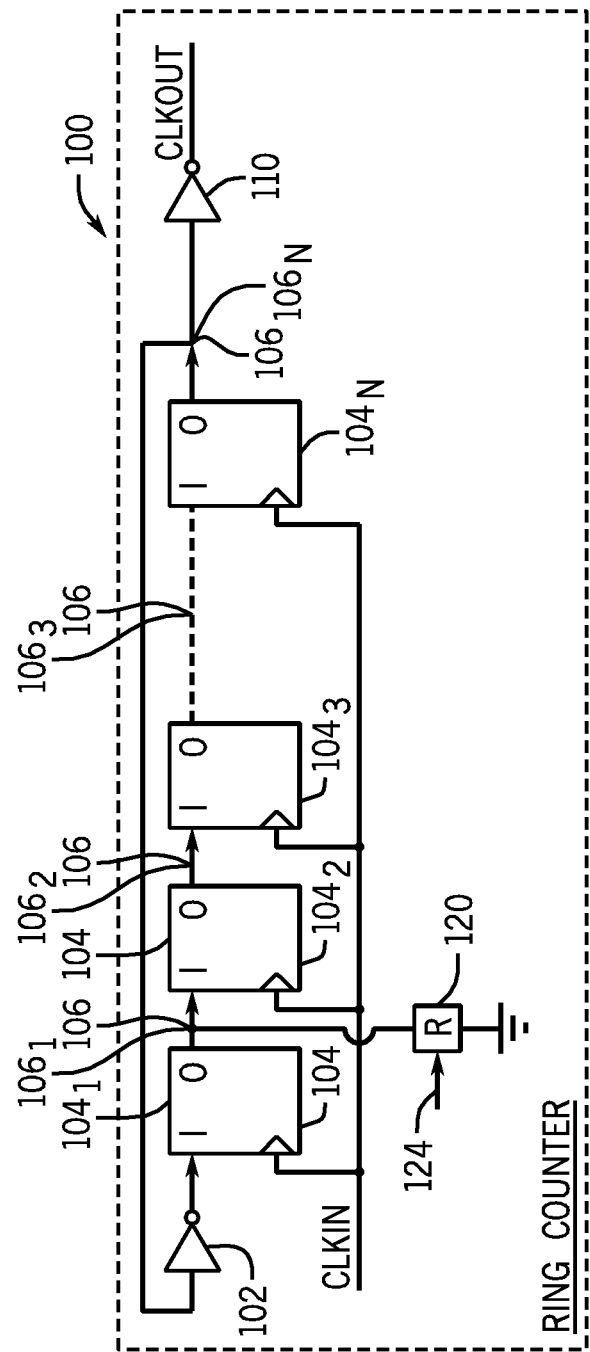
FIG. 3 is a schematic diagram of a ring counter according to an exemplary embodiment.
Figure 5:
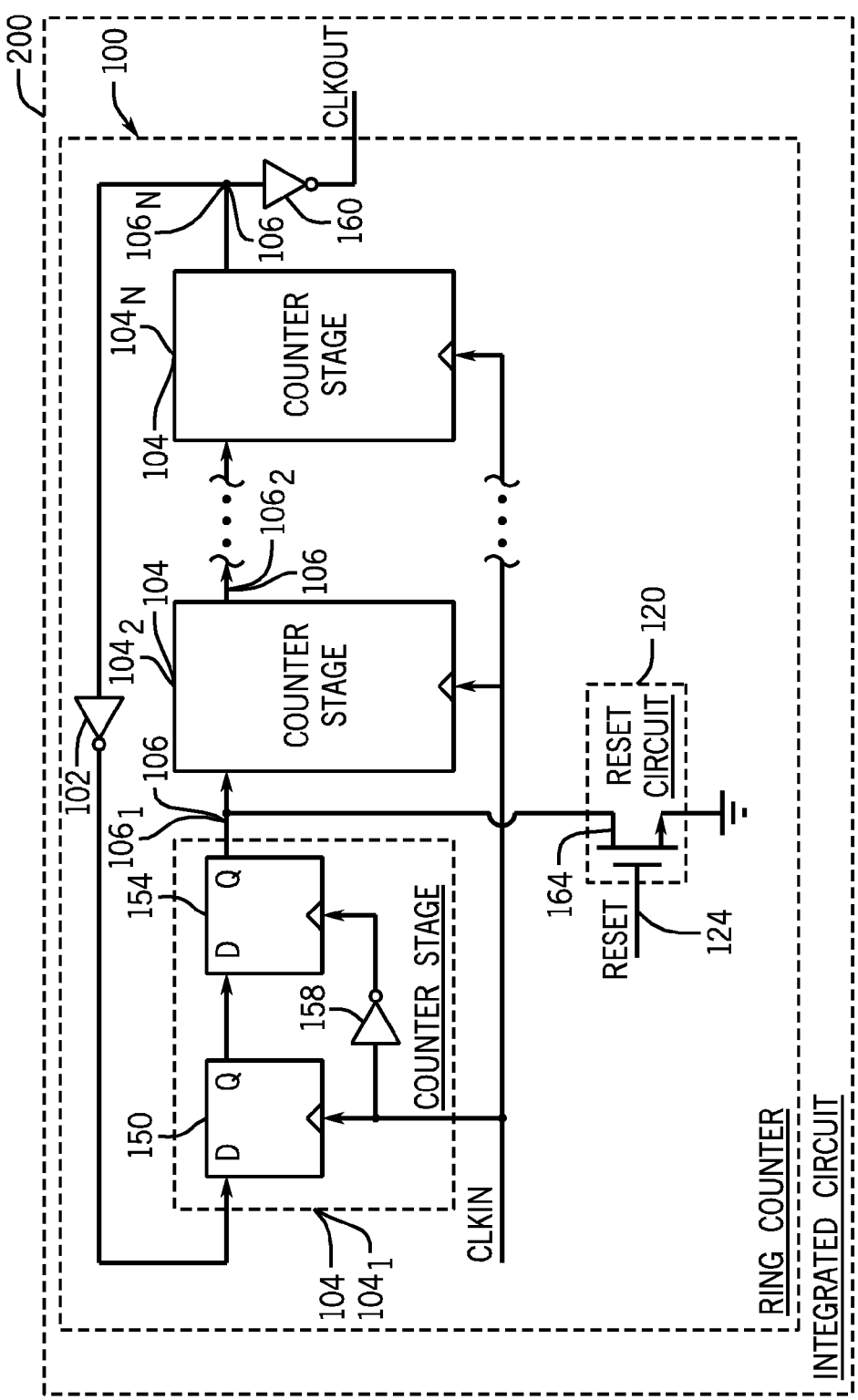
FIG. 5 is a more detailed schematic diagram of the ring counter of FIG. 3 according to an exemplary embodiment.

Referring to FIG. 3, the ring counter 54, 80 may have a design similar to a ring counter 100, in accordance with exemplary embodiments. Referring to FIG. 5, in accordance with an exemplary embodiment, all or part of the ring counter 100 may be fabricated on a single semiconductor die or may be fabricated on multiple semiconductor dies. Regardless, the ring counter 100 may be part of an integrated circuit 200. In general, the ring counter 100 is a circular shift register that is formed from serially coupled register stages 104 (register stages $104_1$, $104_2$, $104_3$ . . . $104_N$, being depicted in FIG. 3 as a non-limiting example), which are each clocked by a clock signal called "CLKIN." In this manner, each stage 104 has an associated output node 106 (nodes $106_1$, $106_2$, $106_3$ . . . $106_N$, being depicted as examples in FIG. 3) such that an input node of each stage 104 receives a signal provided by the output node 106 from another one of the stages 104. The last output node $106_N$ of the last stage $104_N$ is coupled back to the input node of the first stage $104_1$. In this regard, the output signal appearing on the output node $106_N$ is inverted (via an inverter 102) and provided to the input terminal stage $104_1$.

The ring counter 100 divides the frequency of the CLKIN input clock signal by 2N, where "N" represents the number of stages 104. Any of the nodes 106, in general, may be used to provide a divided clock signal having a fifty percent duty cycle with the divided clock frequency. As a non-limiting example, FIG. 3 depicts the output node $106_N$ being coupled to an inverter 110 to provide an output clock signal called "CLKOUT." As a more specific example, Table 1 depicts the logical states of the signals provided by the stages (i.e., provided at the corresponding output nodes 106) of a five stage ring counter (i.e., N=5) which forms a divide-by-ten counter for ten cycles of the CLKIN clock signal:

TABLE 1

| CLKIN CYCLE NO. | STG 1 | STG 2 | STG 3 | STG 4 | STG 5 |
|---|---|---|---|---|---|
| 1 | 0 | 0 | 0 | 0 | 0 |
| 2 | 1 | 0 | 0 | 0 | 0 |
| 3 | 1 | 1 | 0 | 0 | 0 |
| 4 | 1 | 1 | 1 | 0 | 0 |
| 5 | 1 | 1 | 1 | 1 | 0 |
| 6 | 1 | 1 | 1 | 1 | 1 |
| 7 | 0 | 1 | 1 | 1 | 1 |
| 8 | 0 | 0 | 1 | 1 | 1 |
| 9 | 0 | 0 | 0 | 1 | 1 |
| 10 | 0 | 0 | 0 | 0 | 1 |

Upon reset of the ring counter, the reset state of the counter may be undetermined if all stages of the ring counter are not reset. In particular, when the number of stages N is greater than two, there may be many possible logical states for the stages of the ring counter after a reset. Therefore, if measures are not undertaken to initialize the ring counter with an appropriate sequence (such as a reset sequence of all zeros for its stages, for example), the output signal from the ring counter emerging from reset may not a periodicity of 2N, and moreover, it may not be possible to use any of the output nodes of the stages as a divided clock output. In accordance with example embodiments disclosed herein, the ring counter 100 is reset in a manner that is efficient with respect to the die area consumed by the reset circuitry.

As depicted in FIG. 3, in accordance with an exemplary embodiment, the ring counter 100 includes a reset circuit 120, which forms a controller that is activated upon reset of the ring counter 100 for purposes of driving a single output node 106 of the ring counter 100 to a predetermined signal state and allowing the clocking of the ring counter 100 to propagate the signal state to the other output nodes 106 to thereby program the counter 100 with a reset sequence. For the example that is depicted in FIG. 3, the reset circuit 120 is coupled to the output node $106_1$. Due to the ring counter 100 employing a single point reset, a deterministic start-up state is provided for the ring counter 100; and moreover, due to the single point reset, parasitic capacitances are minimized, thereby enhancing the circuit speed of the ring counter 100.

Figure 4:
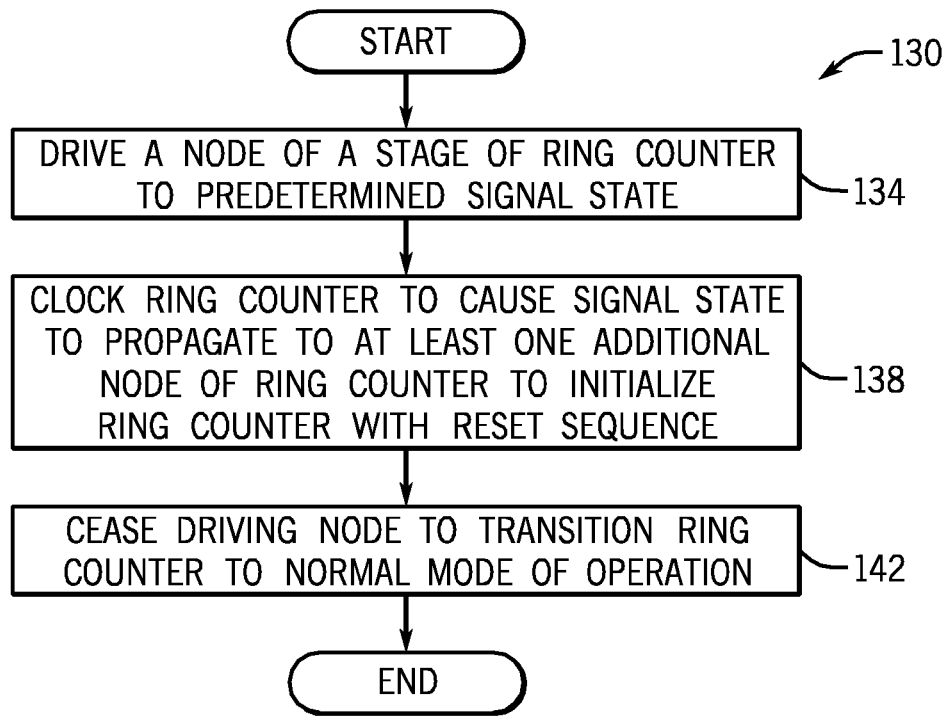
FIG. 4 is a flow diagram depicting a technique to initialize a ring counter according to an exemplary embodiment.

In accordance with an exemplary embodiment, a technique 130 that is depicted in FIG. 4 may be used to initialize the ring counter 100 upon reset. Pursuant to the technique 130, a node of a stage of the ring counter is driven (block 134) to a predetermined signal state. Next, while the node is driven to the predetermined signal state, the ring counter is clocked (block 138) to cause the signal state to propagate to at least one additional node (of at least one additional stage) of the ring counter to initialize the ring counter with a reset sequence. Therefore, in accordance with exemplary embodiments, the ring counter is clocked to cause the signal state formed at the node to propagate to the other nodes to initialize the ring counter with the reset sequence, such as a reset sequence of logical "0s" for all of the nodes 106, for example. Pursuant to the technique 130, after the reset sequence is achieved, the driving of the node ceases (block 142) to transition the ring counter to a normal mode of operation (i.e., transition the ring counter out of reset) to allow the ring counter to provide a divided clock signal having a known periodicity.

In accordance with an exemplary embodiment, the stage 104 of the ring counter 100 may be a master-slave stage that is formed from D-type flip-flop stages. In this regard, a given stage 104, such as exemplary stage $104_1$ depicted in FIG. 5, may include a first master D-type flip-flop 150, which is clocked by the CLKIN clock signal to update its non-inverting output terminal on the positive going edges (as an example) of the CLKIN clock signal. A slave D-type flip-flop 154 of the stage $104_1$ receives the signal from the non-inverting output terminal of the D-type flip-flop 150 and is clocked by the inverted CLKIN signal (provided by an inverter 158 that receives the CLKIN clock signal). The output terminal of the slave D-type flip-flop 154, in turn, updates its non-inverting output terminal on the negative going edges of the CLKIN signal (for this example), and this output terminal forms the output node $106_1$. Therefore, due to this arrangement, the stage $104_1$ samples the input signal for the stage $104_1$ on the positive going edges of the CLKIN clock signal and updates the signal state of the output node $106_1$ on the negative going edges of the CLKIN clock signal.

It is noted that the stage 104 may have many different implementations, other than the one depicted in FIG. 5, in accordance with other exemplary embodiments.

For the example that is depicted in FIG. 5, the reset circuit 120 includes an n-channel metal-oxide-semiconductor field-effect-transistor (NMOSFET) 164. In this regard, the gate terminal of the NMOSFET 164 is coupled to an input terminal 124 of the reset circuit 120; the drain terminal of the NMOSFET 164 is coupled to the output node $106_1$; and the source terminal of the NMOSFET 164 is coupled to ground. In an exemplary embodiment, a controller (a microprocessor or logic, as non-limiting examples) of the wireless device 10 (see FIG. 1) may assert a signal (called "RESET" in FIG. 5) to reset the ring counter 100, which causes the NMOSFET 164 to drive the output node 106$_1$ low (e.g., couple the output node 106$_1$ to ground) to thereby force the output node 106$_1$ to a logic zero value. This reset may occur, for example, at power up of the wireless device 10, when the wireless device 10 is reset, when a PLL incorporating the ring counter 100 is reset, etc. As the CLKIN clock signal is clocked during the reset of the ring counter 100, this logic zero value propagates to the output nodes 106$_2$ . . . 106$_N$ of the other counter stages 104$_2$-104$_N$. Thus, after the requisite number of clock cycles, the controller 30 may de-assert the RESET signal to allow the stage 104$_1$ to subsequently control the signal state of the output node 106$_1$ during the normal mode of operation of the ring counter 100. It is noted that the NMOSFET 164 has a sufficient aspect ratio, or is appropriately sized, for purposes of forcing the output node 106$_1$ to the low state relative to the transistor of the D-type flip-flop 154 that drives the output node 106$_1$.

Figure 6:
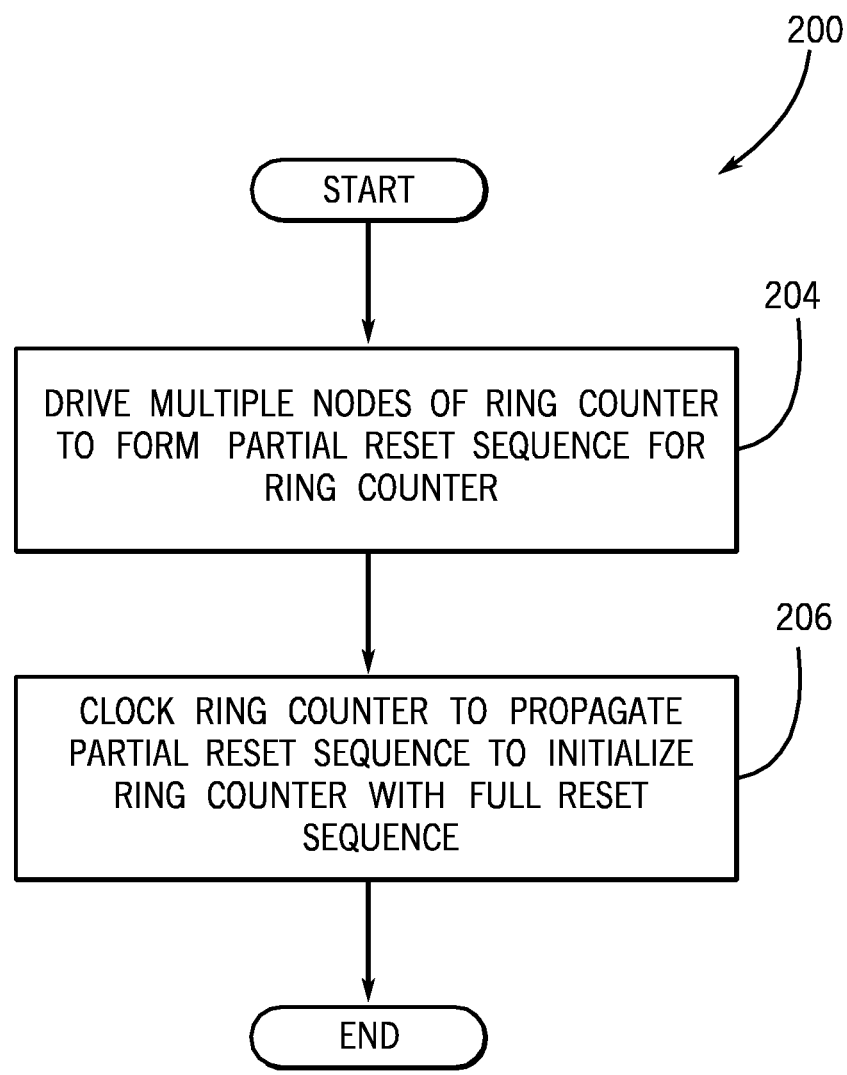
FIG. 6 is a flow diagram depicting a technique to initialize a ring counter according a further exemplary embodiment.

Although a single node reset has been described, in other embodiments, more than one node 106 may be reset (via one or more additional corresponding reset circuits 120). Referring to FIG. 6, in this manner, in these embodiments, in a technique 200, multiple but not all of the nodes 106 of the ring counter 100 may be driven (block 204) to predetermined signal states to form a partial, logically consistent reset sequence for the ring counter 100, and the ring counter 100 may then be clocked (block 206) to propagate this partial reset sequence for purposes of initializing the ring counter 100 with the full reset sequence. As non-limiting examples, every second, third or fourth output node 106 may be driven to a predetermined signal state (a logic zero state, for example) by a corresponding reset circuit 120; and while these output nodes 106 are driven to the predetermined signal states, the ring counter 100 may be clocked to propagate the predetermined signal states to the non-driven nodes 106 to initialize the ring counter 100 with the full reset sequence. By driving several nodes of the ring counter 100, the propagation delay of the reset signal to force a predetermined state of the ring counter 100 may therefore be reduced.

While a limited number of examples have been disclosed herein, those skilled in the art, having the benefit of this disclosure, will appreciate numerous modifications and variations therefrom. It is intended that the appended claims cover all such modifications and variations.

What is claimed is:

1. A method comprising:
  establishing a partial reset sequence for a ring counter, wherein the ring counter comprises a plurality of stages associated with a plurality of nodes, and establishing the partial reset sequence comprises driving a subset of nodes of the plurality of nodes to initialize the plurality of nodes to the partial reset sequence; and
  clocking the ring counter to propagate the partial reset sequence to initialize the ring counter with a reset sequence.

2. The method of claim 1, further comprising ceasing the driving of the plurality of nodes to transition the ring counter out of a reset state.

3. The method of claim 1, wherein the driving comprises driving an output node of a stage of the plurality of stages.

4. The method of claim 1, wherein the driving comprises activating a plurality of transistors to force the plurality of nodes to predetermined signal states in response to a reset of the ring counter.

5. An apparatus comprising:
  a ring counter comprising a plurality of stages associated with a plurality of nodes; and
  a controller coupled to the ring counter and adapted to drive a subset of nodes of the plurality of nodes to establish a partial reset sequence and clock the ring counter to cause the partial reset sequence to propagate to at least one other node of the plurality of nodes to initialize the ring counter with a reset sequence.

6. The apparatus of claim 5, wherein the controller is further adapted to cease driving the subset of nodes to transition the ring counter out of a reset state.

7. The apparatus of claim 5, wherein a node of the subset of nodes comprises an output node of a register stage of the ring counter.

8. The apparatus of claim 5, wherein the controller comprises at least one transistor adapted to force at least one node of the subset of nodes to a predetermined signal state in response to a reset signal.

9. The apparatus of claim 5, further comprising a buffer coupled to a node of the plurality of nodes to provide an output signal for a frequency divider.

10. An apparatus comprising:
  an integrated circuit comprising a ring counter and a controller, wherein:
    the ring counter comprises a plurality of stages associated with a plurality of nodes, and
    the controller is adapted to drive a subset of nodes associated with the plurality of stages to initialize the plurality of nodes to a predetermined partial reset sequence and clock the ring counter to cause the partial reset sequence to propagate to at least one other node associated with the plurality of nodes to reset the ring counter.

11. The apparatus of claim 10, wherein the controller is further adapted to transition the ring counter out of a reset state.

12. The apparatus of claim 10, wherein at least one node of the subset of nodes comprises an output node of a stage of the plurality of stages.

13. The apparatus of claim 10, wherein the controller comprises transistors adapted to force the subset of nodes to initiate the plurality of nodes to the predetermined partial reset sequence in response to a reset signal.

\* \* \* \* \*